US012588234B2

(12) United States Patent
Chang et al.

(10) Patent No.: US 12,588,234 B2
(45) Date of Patent: Mar. 24, 2026

(54) SEMICONDUCTOR DEVICES WITH IMPLANTED STI REGIONS AND METHODS OF FORMING THE SAME

(71) Applicant: Taiwan Semiconductor Manufacturing Company, Ltd., Hsinchu (TW)

(72) Inventors: I-Ming Chang, Hsinchu (TW); Yao-Sheng Huang, Hsinchu (TW); Hsiang-Pi Chang, Hsinchu (TW); Yi-Ruei Jhan, Hsinchu (TW); Huang-Lin Chao, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 482 days.

(21) Appl. No.: 18/177,381

(22) Filed: Mar. 2, 2023

(65) Prior Publication Data

US 2024/0297244 A1    Sep. 5, 2024

(51) Int. Cl.
| | |
|---|---|
| *H10D 30/43* | (2025.01) |
| *H10D 30/01* | (2025.01) |
| *H10D 30/67* | (2025.01) |
| *H10D 62/10* | (2025.01) |
| *H10D 64/01* | (2025.01) |
| *H10D 84/01* | (2025.01) |
| *H10D 84/03* | (2025.01) |
| *H10D 84/83* | (2025.01) |

(52) U.S. Cl.
CPC .......... *H10D 30/43* (2025.01); *H10D 30/014* (2025.01); *H10D 30/6735* (2025.01); *H10D 62/121* (2025.01); *H10D 64/017* (2025.01); *H10D 84/0151* (2025.01); *H10D 84/038* (2025.01)

(58) Field of Classification Search
CPC .......... H10D 30/6735; H10D 84/0151; H10D 30/6757; H10D 30/43; H10D 84/038; H10D 30/014; H10D 62/121; H10D 64/017
See application file for complete search history.

(56) References Cited

U.S. PATENT DOCUMENTS

2020/0279913 A1*    9/2020    Ebrish .................. H10D 84/834

* cited by examiner

*Primary Examiner* — Changhyun Yi
(74) *Attorney, Agent, or Firm* — Foley & Lardner LLP

(57) ABSTRACT

A method for fabricating semiconductor devices includes forming a stack structure protruding from a substrate and including a plurality of first semiconductor layers and a plurality of second semiconductor layers stacked on top of one another. The method includes forming an isolation structure overlaying the substrate and a lower portion of the stack structure. The method includes implanting dopants into at least an upper portion of the isolation structure.

20 Claims, 18 Drawing Sheets

Figure 4:
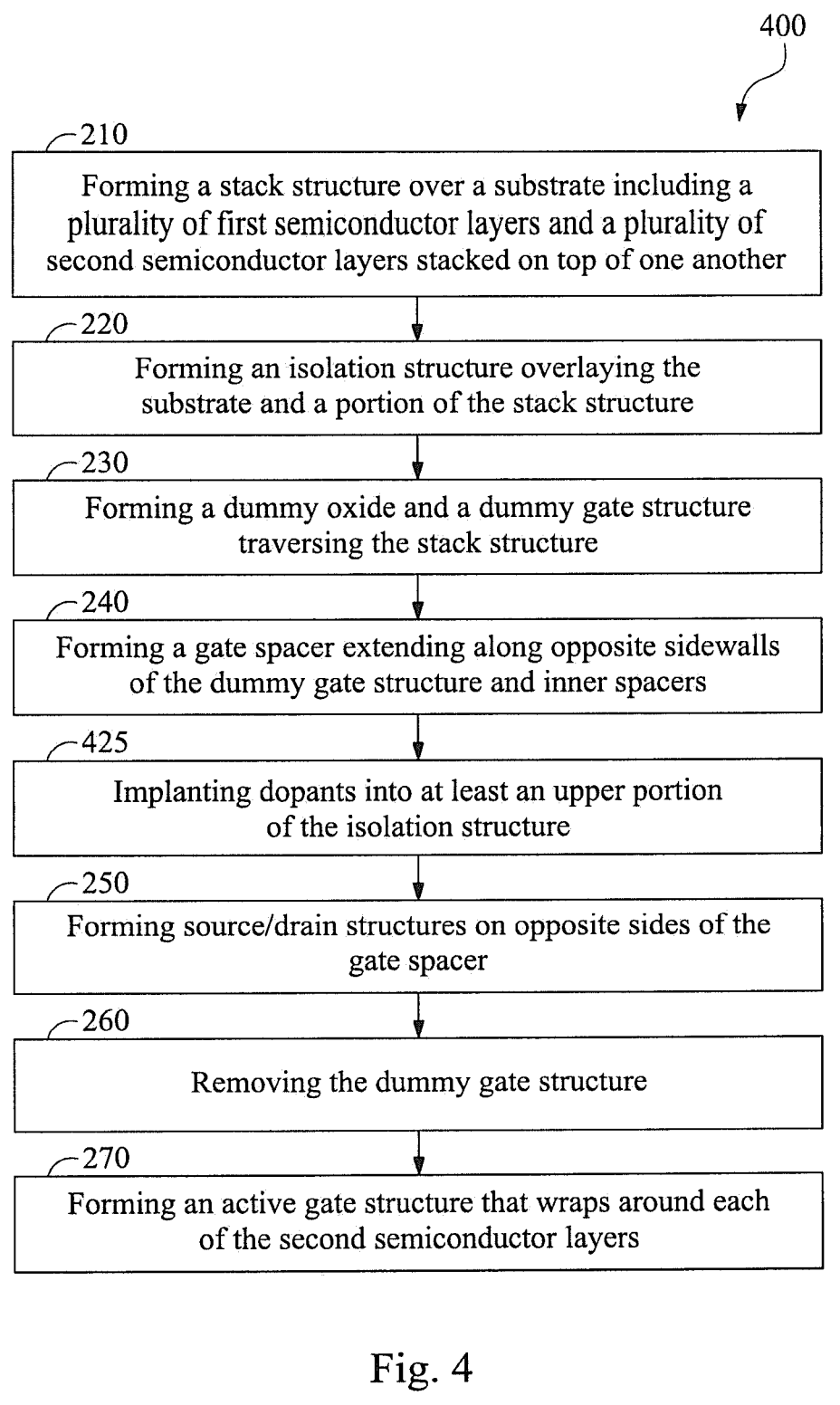

400

210

Forming a stack structure over a substrate including a plurality of first semiconductor layers and a plurality of second semiconductor layers stacked on top of one another

220

Forming an isolation structure overlaying the substrate and a portion of the stack structure

230

Forming a dummy oxide and a dummy gate structure traversing the stack structure

240

Forming a gate spacer extending along opposite sidewalls of the dummy gate structure and inner spacers

425

Implanting dopants into at least an upper portion of the isolation structure

250

Forming source/drain structures on opposite sides of the gate spacer

260

Removing the dummy gate structure

270

Forming an active gate structure that wraps around each of the second semiconductor layers

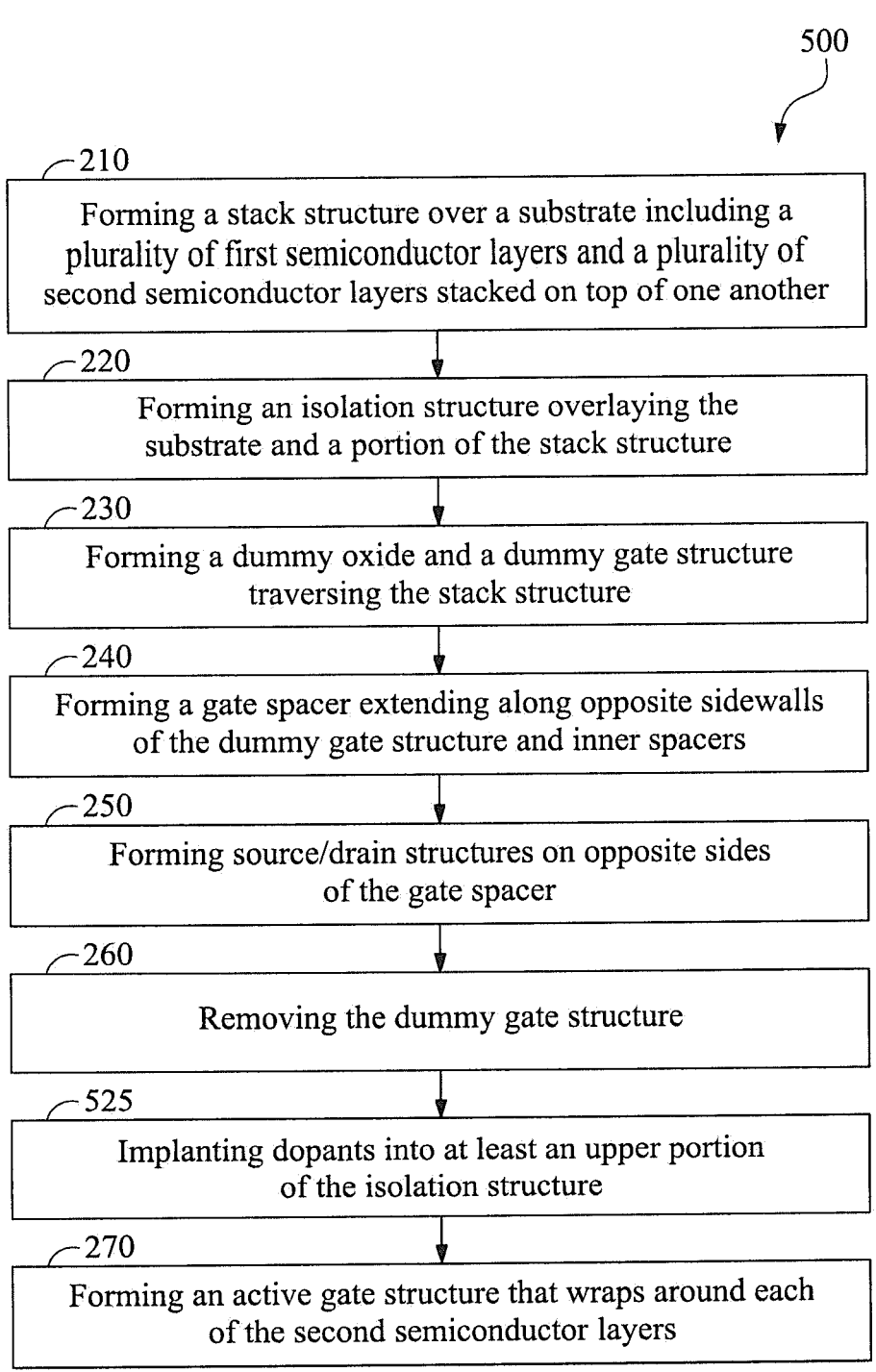

210

Forming a stack structure over a substrate including a plurality of first semiconductor layers and a plurality of second semiconductor layers stacked on top of one another

220

Forming an isolation structure overlaying the substrate and a portion of the stack structure

230

Forming a dummy oxide and a dummy gate structure traversing the stack structure

240

Forming a gate spacer extending along opposite sidewalls of the dummy gate structure and inner spacers

250

Forming source/drain structures on opposite sides of the gate spacer

260

Removing the dummy gate structure

525

Implanting dopants into at least an upper portion of the isolation structure

270

Forming an active gate structure that wraps around each of the second semiconductor layers

Fig. 5

600
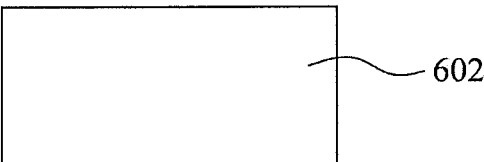
602
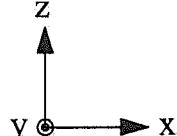
Fig. 6

600
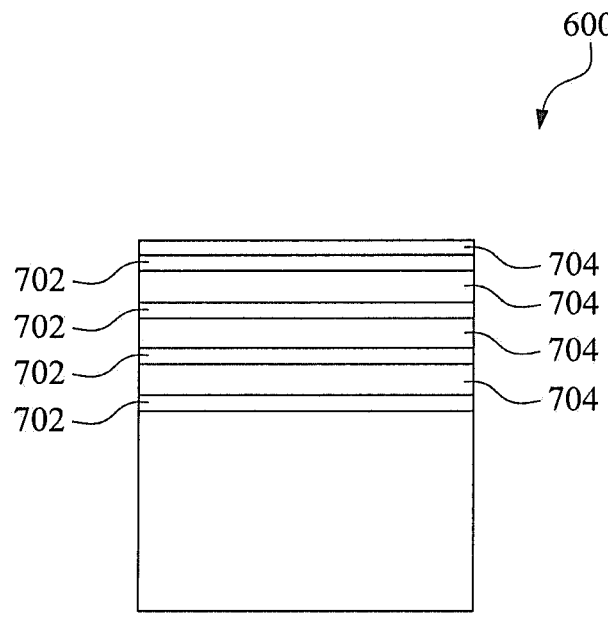
702
702
702
702
702
704
704
704
704
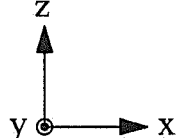
Fig. 7

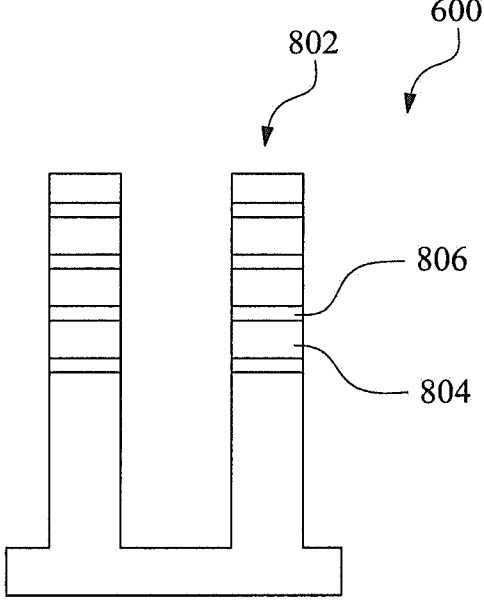
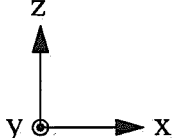
Fig. 8

600

902 z y  x

600

950

904

902 z y  x

600 z x    y

1802

SEMICONDUCTOR DEVICES WITH IMPLANTED STI REGIONS AND METHODS OF FORMING THE SAME

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, and 5 are example flowcharts of methods for fabricating a semiconductor device, in accordance with some embodiments.

FIGS. 6, 7, 8, 9A, 9B, 10, 11A, 11B, 12A, 12B, 13, 14, 15, 16, 17A, 17B, and 18 illustrate an example semiconductor device during various fabrication stages, made by the methods described with respect to FIGS. 2-5, in accordance with some embodiments.

DETAILED DESCRIPTION

Figure 1:
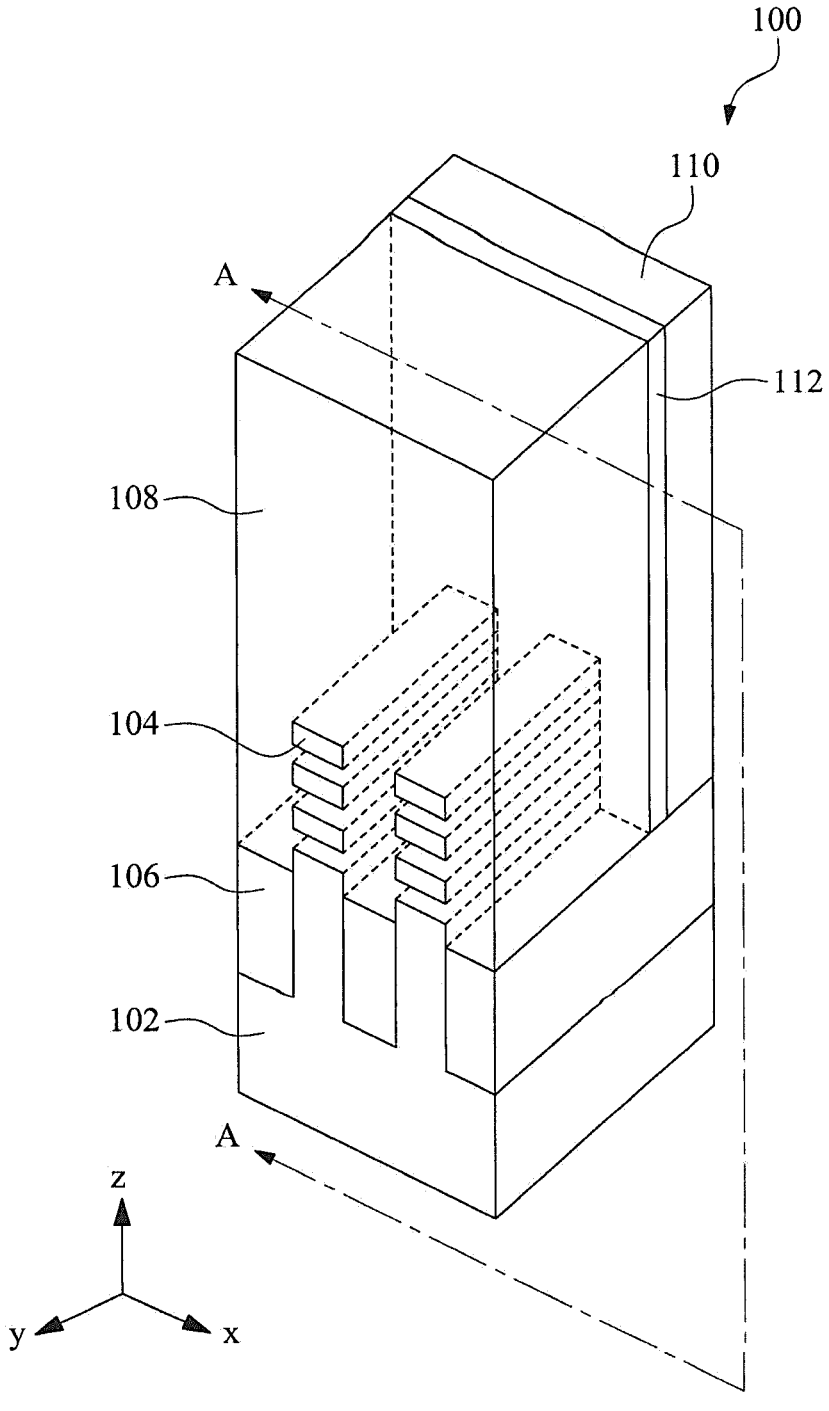
FIG. 1 illustrates a perspective view of a field-effect-transistor (FET) device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Continued innovations in semiconductor process technologies are enabling higher integration densities and device scaling. As the semiconductor industry moves towards smaller technology nodes, planar and non-planar semiconductor field-effect-transistor (FET) device structures should be scaled to smaller dimensions to provide increased device width per footprint area. In this regard, nanostructure (e.g., nanosheet, nanowire, or otherwise gate-all-around (GAA)) FET devices are considered to be a viable option for continued complementary-metal-oxide-semiconductor (CMOS) scaling. In general, a nanostructure FET device includes a device channel which includes one or more nanosheet layers in a stacked configuration. Each nanosheet layer typically has a vertical thickness that is substantially less than its width. A gate structure is formed above and below each nanosheet layer in a stacked configuration, thereby increasing the FET device width (or channel width), and thus the drive current, for a given footprint area.

One challenge in fabricating nanostructure FET devices is the ability to effectively prevent current leakage between adjacent semiconductor device components. To suppress current leakage, shallow trench isolation (STI) has been utilized. However, depending on the FET device structure and/or fabrication processes, STI regions are damaged during the fabrication processes, thereby ineffectively preventing current leakage. For example, STI regions can be damaged (i.e., loss of the STI regions) during various etch stages (e.g., recess processes, inner spacer trim processes, etc.) and/or cleaning processes, which could cause degradation of AC performance and/or could induce merge defects. Thus, the existing techniques to fabricate FET devices may not be entirely satisfactory in some aspects.

Embodiments of the present disclosure are discussed in the context of forming a gate-all-around (GAA) field-effect-transistor (FET) device. To prevent loss of STI regions in the disclosed GAA FET devices and thus prevent current leakage, implantation processes may be implemented. Such a process can modify dielectric properties of a top portion of the STI regions locally so as to prevent loss of the STI regions during the following fabrication processes. Advantages of the implantation processes include prevent loss of STI regions while not substantially affecting sidewalls of other layers (e.g., channel layers). The present disclosure provides various embodiments of methods to implant dopants into the STI regions of a GAA FET device at various stages during the fabrication process. For example, the implantation process may be performed after isolation structures (i.e., STI regions) are formed. For example, the implantation process may be performed after dummy oxide structures are formed. For example, the implantation process may be performed after a gate spacer is formed. For example, the implantation process may be performed after dummy gate structures are removed. As such, the implantation process can modify dielectric properties of at least a portion of STI regions, thereby preventing loss of the STI regions and thus preventing current leakage.

FIG. 1 illustrates a perspective view of an example GAA FET device 100, in accordance with various embodiments. The GAA FET device 100 includes a semiconductor substrate (or semiconductor well) 102, and a plurality of nanostructures (e.g., nanosheets, nanowires, etc.) 104. The plurality of nanostructures 104 are vertically stacked on top of one another. Isolation regions 106 are formed on opposing sides of a protruded portion of the substrate 102, with the nanostructures 104 disposed above the protruded portion. A gate structure 108 wraps around each of the nanostructures 104 (e.g., a full perimeter of each of the nanostructures 104). Source/drain structures are disposed on opposing sides of the gate structure 108, e.g., source/drain structure 110 shown in FIG. 1. A gate spacer 112 is disposed between the gate structure 108 and the source/drain structure 110.

The GAA FET device shown in FIG. 1 is simplified, and thus, it should be understood that one or more features of a completed GAA FET device may not be shown in FIG. 1. For example, the other source/drain structure opposite the gate structure 108 from the source/drain structure 110 and interlayer dielectric (ILD) structures disposed over that source/drain structure are not shown in FIG. 1. Further, FIG. 1 is provided as a reference to illustrate a number of cross-sections in subsequent figures. As indicated, cross-section A-A is cut along a plane including the x axis and z axis. Subsequent figures refer to these reference cross-sections for clarity.

FIGS. 2-5 illustrate flowcharts of methods 200-500, respectively, to form a nanostructure FET device, according to one or more embodiments of the present disclosure. For example, at least some of the operations (or steps) in one of the methods 200-500 can be used to form a FinFET device, a GAA FET device (e.g., GAA FET device 100), a nanosheet transistor device, a nanowire transistor device, a vertical transistor device, a bipolar junction transistor device, a diode device, or the like. It is noted that the methods 200-500 are merely examples, and are not intended to limit the present disclosure. Accordingly, it is understood that additional operations may be provided before, during, and after each of the methods 200-500 of FIGS. 2-5, and that some other operations may only be briefly described herein. In some embodiments, operations of the methods 200-500 may be associated with schematic views of an example GAA FET device at various fabrication stages as shown in FIGS. 6, 7, 8, 9A, 9B, 10, 11A, 11B, 12A, 12B, 13, 14, 15, 16, 17A, 17B, and 18, which will be discussed in further detail below.

In brief overview, the methods 200-500 provide fabrication processes of a GAA FET device wherein an implantation process is performed at a different stage of the fabrication process.

For example, the method 200 starts with operation 210 of forming a stack structure over a substrate. The method 200 continues to operation 220 of forming an isolation structure. The method 200 continues to operation 225 of implanting dopants into at least a portion of the isolation structure. The method 200 continues to operation 230 of forming a dummy oxide and a dummy gate structure. The method 200 continues to operation 240 of forming a gate spacer and inner spacers. The method 200 continues to operation 250 of forming source and drain structures. The method 200 continues to operation 260 of removing the dummy gate structure. The method 200 continues to operation 270 of forming an active gate structure.

In another example, the method 300 starts with operation 210 of forming a stack structure over a substrate. The method 300 continues to operation 220 of forming an isolation structure. The method 300 continues to operation 230 of forming a dummy oxide and a dummy gate structure. The method 300 continues to operation 325 of implanting dopants into at least a portion of the isolation structure. The method 300 continues to operation 240 of forming a gate spacer and inner spacers. The method 300 continues to operation 250 of forming source and drain structures. The method 300 continues to operation 260 of removing the dummy gate structure. The method 300 continues to operation 270 of forming an active gate structure.

In yet another example, the method 400 starts with operation 210 of forming a stack structure over a substrate. The method 400 continues to operation 220 of forming an isolation structure. The method 400 continues to operation 230 of forming a dummy oxide and a dummy gate structure. The method 400 continues to operation 240 of forming a gate spacer and inner spacers. The method 400 continues to operation 425 of implanting dopants into at least a portion of the isolation structure. The method 400 continues to operation 250 of forming source and drain structures. The method 400 continues to operation 260 of removing the dummy gate structure. The method 400 continues to operation 270 of forming an active gate structure.

In yet another example, the method 500 starts with operation 210 of forming a stack structure over a substrate. The method 500 continues to operation 220 of forming an isolation structure. The method 500 continues to operation 230 of forming a dummy oxide and a dummy gate structure. The method 500 continues to operation 240 of forming a gate spacer and inner spacers. The method 500 continues to operation 250 of forming source and drain structures. The method 500 continues to operation 260 of removing the dummy gate structure. The method 500 continues to operation 525 of implanting dopants into at least a portion of the isolation structure. The method 500 continues to operation 270 of forming an active gate structure.

As mentioned above, FIGS. 6-18 each illustrate a portion of the GAA FET device 100 at various fabrication stages of the methods 200-500 in FIGS. 2-5. A GAA FET device 600, which will be described in greater detail below, is similar to the GAA FET device 100 shown in FIG. 1, but with certain features/structures/regions not shown, for the purposes of brevity. For example, the following figures of the GAA FET device 600 do not include ILD structures. It should be understood that the GAA FET device 600 may further include a number of other devices (not shown in the following figures) such as inductors, fuses, capacitors, coils, etc., while remaining within the scope of the present disclosure.

Figure 2:
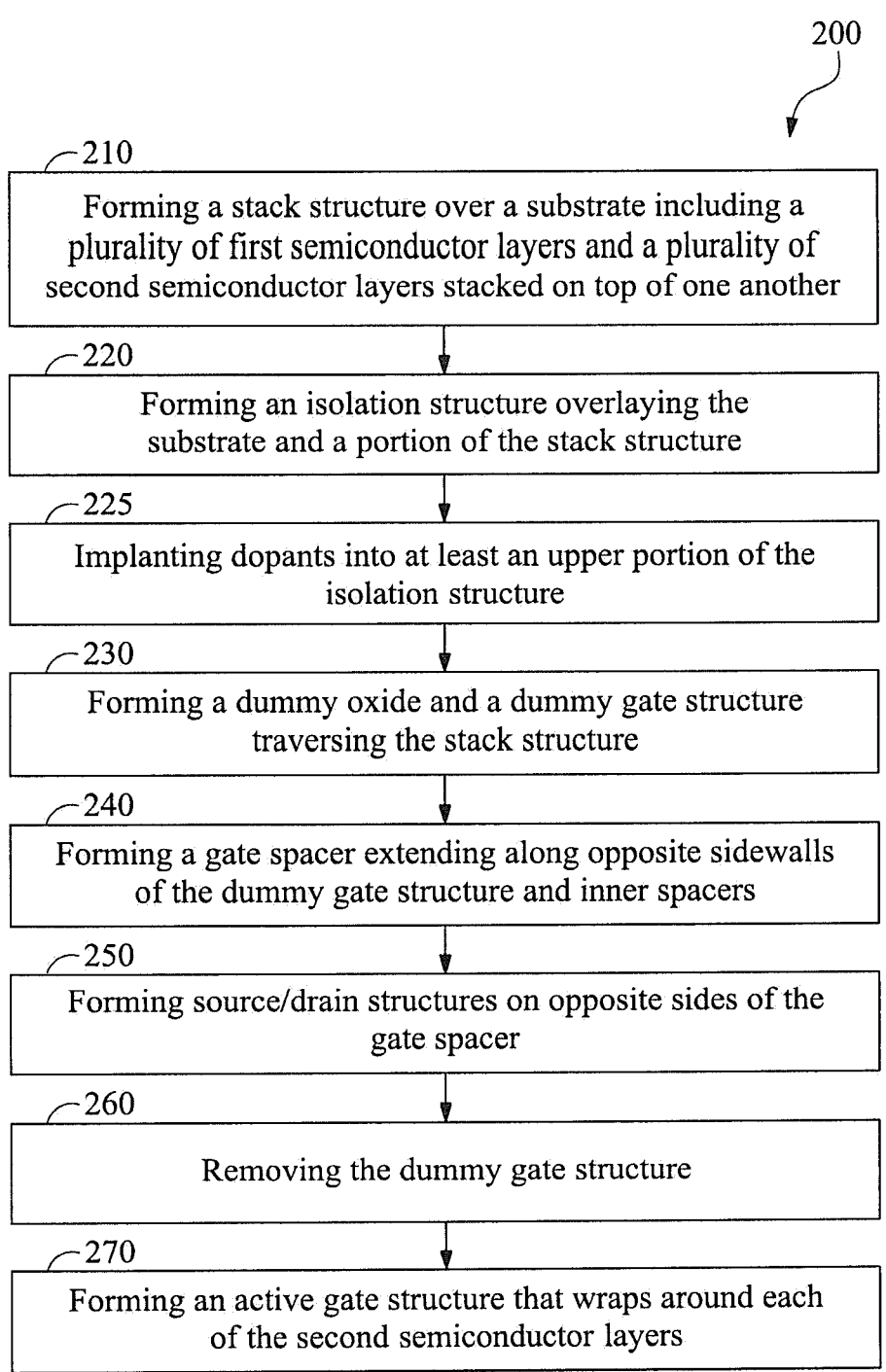

Corresponding to operation 210 of FIG. 2, FIG. 6 is a cross-sectional view of the GAA FET device 600 including a substrate 602, on which a stack structure is to be formed, at one of the various stages of fabrication. The cross-sectional view of FIG. 6 is cut in a direction perpendicular to the lengthwise direction of an active/dummy gate structure of the GAA FET device 600 (e.g., cross-section A-A indicated in FIG. 1).

The substrate 602 may be a semiconductor substrate, such as a bulk semiconductor, a semiconductor-on-insulator (SOI) substrate, or the like, which may be doped (e.g., with a p-type or an n-type dopant) or undoped. The substrate 602 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 602 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Still corresponding to operation 210 of FIG. 2, FIG. 7 is a cross-sectional view of the GAA FET device 600 including a number of first semiconductor layers 702 and a number of second semiconductor layers 704 formed on the substrate 602 at one of the various stages of fabrication. The cross-sectional view of FIG. 7 is cut in a direction perpendicular to the lengthwise direction of an active/dummy gate structure of the GAA FET device 100 (e.g., cross-section A-A indicated in FIG. 1).

Referring to FIG. 7, the first semiconductor layers 702 and the second semiconductor layers 704 are alternatingly disposed on top of one another (e.g., along the z direction) to form a first stack. For example, one of the second semiconductor layers 704 is disposed over one of the first semiconductor layers 702 then another one of the first semiconductor layers 702 is disposed over the second semiconductor layer 704, so on and so forth.

The stack structure may include any number of alternately disposed first semiconductor layers 702 and second semiconductor layers 704, respectively. For example, in FIG. 7, the stack structure includes four first semiconductor layers 702, with four second semiconductor layers 704 alternatingly disposed therebetween and with one of the second semiconductor layers 704 being the topmost semiconductor layer. It should be understood that the GAA FET device 600 can include any number of the first semiconductor layers 702 and any number of the second semiconductor layers 704, with either one of the first semiconductor layer 702 or second semiconductor layer 704 being the topmost semiconductor layer, while remaining within the scope of the present disclosure. Thus, in most of the following discussion, the stack shown in FIG. 7 will be used as a representative example.

The first semiconductor layers 702 and the second semiconductor layers 704 may have respective different thicknesses. Further, the first semiconductor layers 702 may have different thicknesses from one layer to another layer. The second semiconductor layers 704 may have different thicknesses from one layer to another layer. The thickness of each of the first semiconductor layers 702 and the second semiconductor layers 704 may range from few nanometers to few tens of nanometers. The first layer of the stack may be thicker than other semiconductor layers. In an embodiment, each of the first semiconductor layers 702 has a thickness ranging from about 5 nanometers (nm) to about 20 nm, and each of the second semiconductor layers 704 has a thickness ranging from about 5 nm to about 20 nm.

The first semiconductor layers 702 and the second semiconductor layers 704 have different compositions. In various embodiments, the first semiconductor layers 702 and the second semiconductor layers 704 have compositions that provide for different oxidation rates and/or different etch selectivity between the layers. In an embodiment, the first semiconductor layers 702 may include silicon germanium ($Si_{1-x}Ge_x$), and the second semiconductor layers may include silicon (Si). In an embodiment, each of the first semiconductor layers 702 and the second semiconductor layers 704 may be silicon that is undoped or substantially dopant-free (i.e., having an extrinsic dopant concentration from about 0 $cm^{-3}$ to about $1\times10^{17}$ $cm^{-3}$), where for example, no intentional doping may be performed when forming the second semiconductor layers 704 (e.g., of silicon).

In various embodiments, the second semiconductor layers 704 may be intentionally doped. For example, when the GAA FET device 600 is configured in n-type (and operates in an enhancement mode), each of the second semiconductor layers 704 may be silicon that is doped with a p-type dopant such as boron (B), aluminum (Al), indium (In), and gallium (Ga); and when the GAA FET device 600 is configured in p-type (and operates in an enhancement mode), each of the second semiconductor layers 704 may be silicon that is doped with an n-type dopant such as phosphorus (P), arsenic (As), antimony (Sb). In another example, when the GAA FET device 600 is configured in n-type (and operates in a depletion mode), each of the second semiconductor layers 704 may be silicon that is doped with an n-type dopant instead; and when the GAA FET device 600 is configured in p-type (and operates in a depletion mode), each of the second semiconductor layers 704 may be silicon that is doped with a p-type dopant instead. In some embodiments, each of the first semiconductor layers 702 is $Si_{1-x}Ge_x$ that includes less than 50% (x<0.5) Ge in molar ratio. For example, Ge may comprise about 15% to 35% of the first semiconductor layers 702 of $Si_{1-x}Ge_x$ in molar ratio. Furthermore, the first semiconductor layers 702 may include different compositions among them, and the second semiconductor layers 704 may include different compositions among them.

Either of the first semiconductor layers 702 and the second semiconductor layers 704 may include other materials, for example, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or combinations thereof. The materials of the first semiconductor layers 702 and the second semiconductor layers 704 may be chosen based on providing differing oxidation rates and/or etch selectivity.

The first semiconductor layers 702 and the second semiconductor layers 704 may be epitaxially grown from the substrate 602. For example, each of the first semiconductor layers 702 and the second semiconductor layers 704 may be grown by a molecular beam epitaxy (MBE) process, a chemical vapor deposition (CVD) process such as a metal organic CVD (MOCVD) process, and/or other suitable epitaxial growth processes. During the epitaxial growth, the crystal structure of the substrate 602 may extend upwardly, resulting in the first semiconductor layers 702 and the second semiconductor layers 704 having the same crystal orientation as the substrate 602.

Still corresponding to operation 210 of FIG. 2, FIG. 8 shows a cross-sectional view of the GAA FET device 600 wherein fin structures 802 are formed from the stack structure (i.e., the first semiconductor layers 702 and the second semiconductor layers 704) and a portion of the substrate 602. Upon growing the first semiconductor layers 702 and the second semiconductor layers 704 on the substrate 602 (i.e., as a stack), the stack structure may be patterned to form one or more fin structures 802. Each of the fin structures 802 is elongated along a lateral direction (e.g., the y direction), and includes a stack of patterned structures. The patterned structures include nanostructures 804 (formed from the second semiconductor layers 704) and sacrificial structures 806 (formed from the first semiconductor layers 702), which are interleaved by each other. In some embodiments, the nanostructure 804 may be formed from the first semiconductor layers 702, and the sacrificial structure 806 may be formed from the second semiconductor layers 704. The fin structure 802 is formed by patterning the stack structure (i.e., the first semiconductor layers 702 and the second semiconductor layers 704) and a portion of the substrate 602 using, for example, photolithography and etching techniques. For example, a mask layer (which may include multiple layers such as, for example, a pad oxide layer and an overlying pad nitride layer) may be formed over the topmost layer (e.g., the second semiconductor layer 704 in FIG. 7). The pad oxide layer may be a thin film comprising silicon oxide formed, for example, using a thermal oxidation process. The pad oxide layer may act as an adhesion layer between the overlying pad nitride layer and the topmost layer in FIG. 7 (the second semiconductor layer 704 in this case, or the first semiconductor layer 702 in some other embodiments in which the first semiconductor layer 702 is the topmost layer). In some embodiments, the pad nitride layer is formed of silicon nitride, silicon oxynitride, silicon carbonitride, the like, or combinations thereof. The pad nitride layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the mask layer in this example, from subsequent processing steps, such as etching. For example, the photoresist material is used to pattern the pad oxide layer and pad nitride layer to form a patterned mask.

The patterned mask may be subsequently used to pattern exposed portions of the stack structure and the substrate 602 to form trenches (or openings), thereby defining the fin structures 802 between adjacent trenches. When multiple fin structures are formed, such a trench may be disposed between any adjacent ones of the fin structures 802. In some embodiments, the fin structure 802 is formed by etching trenches in the stack structure (i.e., the first semiconductor layer 702 and the second semiconductor layer 704) and the substrate 602 using, for example, reactive ion etch (RIE), neutral beam etch (NBE), the like, or combinations thereof. The etching process may be anisotropic. In some embodiments, the trenches may be strips (when viewed from the top) parallel to each other, and closely spaced with respect to each other. In some embodiments, the trenches may be continuous and surround the fin structure 802.

Figures 9A, 9B:
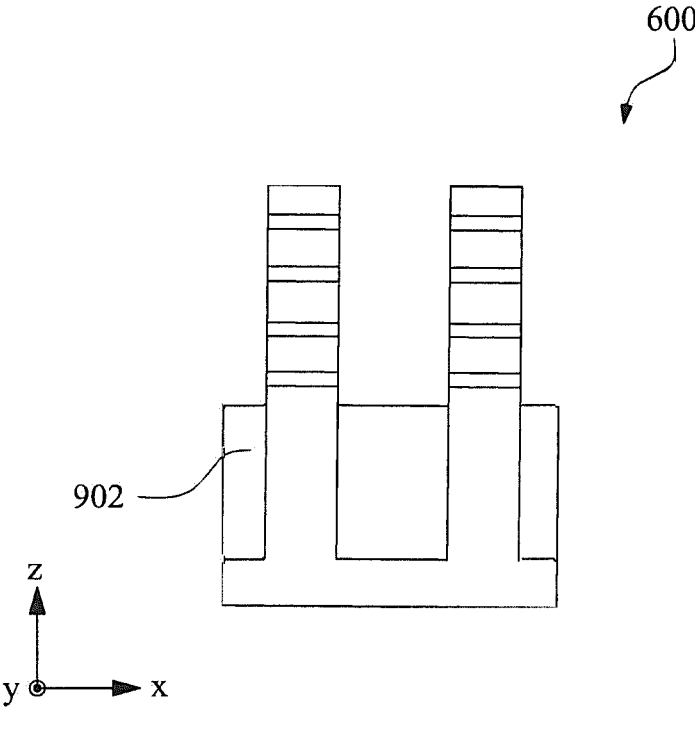

Corresponding to operation 220 of FIG. 2, FIG. 9A is a cross-sectional view of the GAA FET device 600 including one or more isolation structures 902, at one of the various stages of fabrication. The cross-sectional view of FIG. 9A is cut in a direction perpendicular to the lengthwise direction of an active/dummy gate structure of the GAA FET device 600 (e.g., cross-section A-A indicated in FIG. 1).

The isolation structure 902 may include multiple portions. The isolation structure 902 may be formed between adjacent fin structures 802, or next to a single fin structure. The isolation structure 902, which are formed of an insulation material, electrically isolates neighboring fin structures 802 from each other. The insulation material may be an oxide, such as silicon oxide, a nitride, the like, or combinations thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or combinations thereof. Other insulation materials and/or other formation processes may be used. In an example, the insulation material is silicon oxide formed by a FCVD process. An anneal process may be performed once the insulation material is formed. A planarization process, such as a chemical mechanical polish (CMP) process, may remove any excess insulation material and form a top surface of the insulation material and a top surface of a patterned mask (not shown) defining the fin structure 802. The patterned mask may also be removed by the planarization process, in various embodiments.

Next, the insulation material is recessed to form the isolation structure 902, as shown in FIG. 9A, which is sometimes referred to as a shallow trench isolation (STI). The isolation structure 902 is recessed such that the fin structure 802 protrudes from between neighboring portions of the isolation structure 902. The top surface of the isolation structures (STIs) 902 may have a flat surface (as illustrated), a convex surface, a concave surface (such as dishing), or combinations thereof. The top surface of the isolation structure 902 may be formed flat, convex, and/or concave by an appropriate etch. The isolation structure 902 may be recessed using an acceptable etching process, such as one that is selective to the material of the isolation structure 902. For example, a dry etch or a wet etch using dilute hydrofluoric (DHF) acid may be performed to recess the isolation structure 902.

As mentioned above, each of the sacrificial structures 806 and nanostructures 804 of the fin structure 802 is elongated along a lateral direction (e.g., the y direction). For example in FIG. 9A, the nanostructures 804 extend along the y direction, with portions of the isolation structure 902 disposed next to the sides of the nanostructures 804 along the x direction.

Corresponding to operation 206, FIG. 9B is a schematic view of the GAA FET device 600, wherein an implantation process 950 is performed to form implanted layers 904 in the top portion of the isolation structure 902. The implantation process 950 may be an ion implantation process, for example, configured to dope exposed portions of the isolation structure 902 with a dopant species. In some embodiments, the dopant may include carbon, or silicon, or combinations thereof. In some embodiments, a dosage (or concentration) of the implanted dopants may be greater than zero and may have an upper limit of about $3E^{22}$ atoms/cm$^3$. In some embodiments, the implanted layers 904 may be formed in the top portion of the isolation structure 902, wherein a depth (or thickness) of the implanted layers 904 measured from the top surface of the isolation structure 902 may be less than about 20 nm, such as about 10 nm or about 15 nm. In some embodiments, the implantation process 950 may be implemented with an implantation energy, the implantation energy ranging from about 0.3 keV to about 50 keV. For example, the implantation energy may be about 1 KeV for carbon dopants, while the implantation energy may be about 2 KeV for silicon dopants. In some embodiments, an anneal process (e.g., a rapid thermal anneal process) may be performed after performing the implantation process. In some embodiments, the implantation process may be performed at a relatively high temperature. In some embodiments, including methods 300, 400, and 500 described with respect to FIGS. 3-5, operation 225 may be omitted.

Figure 10:
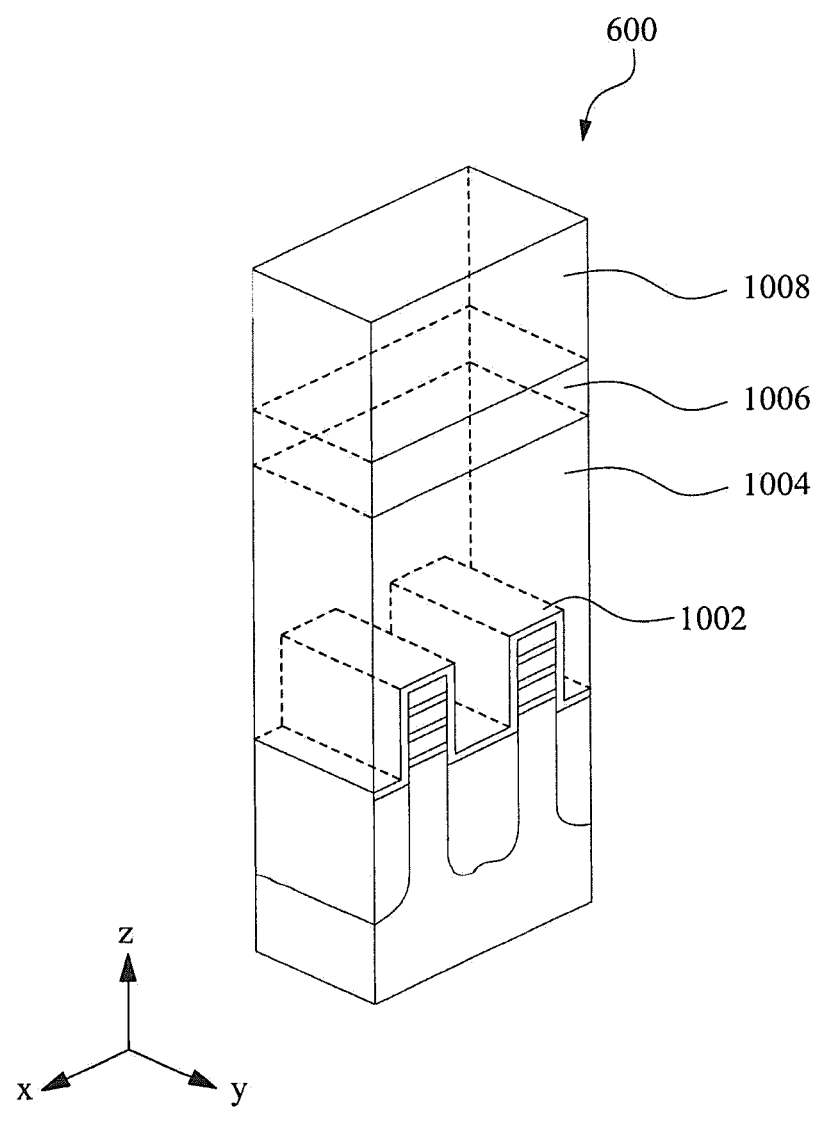

Corresponding to operation 230 of FIG. 2, FIG. 10 is a schematic view of the GAA FET device 600 including a dummy oxide 1002 and a dummy gate 1004, at one of the various stages of fabrication. The dummy oxide 1002 and the dummy gate 1004 can be referred to as a dummy gate structure. As shown in FIG. 10, the dummy oxide 1002 may be (e.g., conformally) formed to overlay the fin structure 802 and the isolation structure 902. For example, the dummy oxide 1002 may overlay a top surface of the fin structure 802 and extend along sidewalls of the fin structure 802, and further extend along the x direction, for example, to overlay the top surface of the isolation structure 902. As such, the dummy oxide 1002 extends along sidewalls of each of the sacrificial structures 806 and each of the nanostructures 804 (that extend along the y direction), as illustrated in FIG. 10.

In some embodiments, the dummy oxide 1002 may be formed with a relatively thin thickness (e.g., from about 2 angstroms (Å) to about 50 (Å)) to smooth the surfaces of the fin structure 802, which may be constituted by multiple different materials. As such, a structure (e.g., a dummy gate structure, and a corresponding active gate structure) overlaying the fin structure 802 can be in better contact with the surfaces of the fin structure 802, which can significantly limit the odds of forming voids along the surfaces of the fin structure 802. Further, in some embodiments, the dummy oxide 1002 may include one or more materials that have a certain etching selectivity with respect to the materials of the sacrificial structures 806 and the nanostructures 804, and the lower portion of the dummy gate 1004. Accordingly, in one or more subsequent fabrication stages (e.g., etching portions of the sacrificial structures and/or the dummy gate to form inner spacers), the sacrificial structures and the dummy gate may each present a curvature-based profile.

In some embodiments, the dummy oxide 1002 may be formed by treating the fin structure 802. The treatment may include oxidizing, nitridizing, and/or sulfurizing the fin structure 802. As such, the dummy oxide 1002 may include one or more treated materials of the sacrificial structures 806 and the nanostructures 804. In an example where the sacrificial structures 806 include SiGe and the nanostructures 804 include Si, the dummy oxide 1002 may include at least one of SiGeO or SiO (e.g., through an oxidizing treatment). In the same example, the dummy oxide 1002 may include at least one of SiGeN or SiN (e.g., through a nitridizing treatment). Continuing with the same example, the dummy oxide 1002 may include at least one of SiGeS or SiS (e.g., through a sulfurizing treatment).

For example, the dummy oxide 1002 may be formed by performing an in-situ or ex-situ plasma process on the fin structure 802. In such a plasma process, passivation gases, such as nitrogen ($N_2$), oxygen ($O_2$), carbon dioxide ($CO_2$), sulfur dioxide ($SO_2$), carbon monoxide (CO), methane ($CH_4$), silicon tetrachloride ($SiCl_4$), and other suitable passivation gases and combinations thereof, can be used. Moreover, the passivation gases can be diluted with gases such as argon (Ar), helium (He), neon (Ne), and other suitable dilutive gases and combinations thereof to reach a certain condition. As a non-limiting example, a source power of 10 watts to 3000 watts, a bias power of 0 watts to 3000 watts, a pressure of 1 millitorr to 5 torr, and an etch gas flow of 0 standard cubic centimeters per minute to 5000 standard cubic centimeters per minute may be used in the plasma process. However, it is noted that source powers, bias powers, pressures, and flow rates outside of these ranges can also be contemplated.

In another example, the dummy oxide 1002 may be formed by performing an ex-situ chemical/wet process on the fin structure 802. In such a chemical/wet process, passivation gases, such as ozone ($O_3$), carbon dioxide ($CO_2$), and other suitable passivation gases and combinations thereof, can be used, with assistive etch chemicals, such as sulfuric acid ($H_2SO_4$), ammonia ($NH_3$), and other suitable assistive etch chemicals and combinations thereof as well as solvents such as deionized water, alcohol, acetone, and other suitable solvents and combinations thereof.

In some other embodiments, the dummy oxide 1002 may be formed by depositing a material over the fin structure 802. In such a case, the dummy oxide 1002 may include, for example, silicon oxide ($SiO_2$), silicon nitride (SiN), silicon oxynitride (SiON), silicon carbide (SiC), silicon carbonitride (SiCN), silicon oxycarbonitride (SiOCN), silicon oxycarbide (SiOC), or combinations thereof. The deposition can include CVD, PECVD, ALD, FCVD, or combinations thereof.

As shown in FIG. 10, the GAA FET device 600 includes the dummy gate 1004, at one of the various stages of fabrication. The dummy gate 1004 is formed over the fin structure 802 and the isolation structure 902, with the dummy oxide 1002 disposed therebetween. The dummy gate 1004 may extend along a lateral direction (e.g., the x direction) perpendicular to the lateral direction along which the fin structure 802 extends. The dummy gate 1004 may be placed where an active (e.g., metal) gate structure is later formed, in various embodiments. In some embodiments, the dummy gate 1004 may be placed over a portion of the fin structure 802, with the dummy oxide 1002 sandwiched therebetween. Such an overlaid portion of the fin structure 802 is later formed as a conduction channel, which includes portions of the nanostructures 804 and portions of the sacrificial structures 806 that are each replaced with an active gate structure. As such, the active gate structure can wrap around each of the portions of the nanostructures 804.

In some embodiments, the dummy gate 1004 may include one or more Si-based or SiGe-based materials that are similar (or having similar etching rates) as the sacrificial structures 806 such as, for example, SiGe. The dummy gate 1004 may be deposited by CVD, PECVD, ALD, FCVD, or combinations thereof. Although the dummy gate 1004 is shown as being formed as a single-piece in the illustrated embodiment of FIG. 7, it should be understood that the dummy gate 1004 may be formed to have multiple portions, each of which may include respective different materials. For example, the dummy gate 1004 may include a lower portion that extends from the isolation structure 902 to around a top surface of the dummy oxide 1002, and an upper portion that further extends from the lower portion. In such embodiments, the lower portion of the dummy gate 1004 may include the above-mentioned material that has a similar etching rate as the sacrificial structures 806 (e.g., SiGe), and the upper portion of the dummy gate 1004 may include a material that has a certain etching selectivity with respect to the fin structure 802 or is unfavorable to epitaxially grow source/drain structures.

Still corresponding to operation 230 of FIG. 2, in some embodiments, the GAA FET device 600 may include a hardmask layer. The hardmask layer may include multiple layers such as, for example, a nitride hardmask 1006 and an oxide hardmask 1008, which are formed over the topmost layer of the GAA FET device 600 (e.g., the dummy gate 1004 in FIG. 10). In some embodiments, the nitride hardmask 1006 may act as an adhesion layer between the topmost layer and the oxide hardmask 1008. In some embodiments, the hardmask layer may include silicon nitride, silicon oxynitride, silicon carbonitride, the like, or combinations thereof. In some other embodiments, the hardmask layer may include a material similar as a material of the sacrificial structures 806 and the nanostructures 804 such as, for example, $Si_{1-y}Ge_y$, Si, etc., in which the molar ratio (y) may be different from or similar to the molar ratio (x) of the sacrificial structures 806. The hardmask layer may be formed over the stack (i.e., before pattering the stack) using low-pressure chemical vapor deposition (LPCVD) or plasma enhanced chemical vapor deposition (PECVD), for example.

Still corresponding to operation 230 of FIG. 2, FIG. 11 is a schematic view of the GAA FET device 600 in which portions of the dummy gate structure (i.e., the dummy oxide 1002 and the dummy gate 1004) and the hardmask layers (i.e., the nitride hardmask 1006 and the oxide hardmask 1008) are removed, at one of the various stages of fabrication. The dummy gate structures and the hardmask layers may be patterned to form elongated structures 1102, as shown in FIG. 11. Each of the elongated structures 1102 is elongated along the x direction, and includes a stack of patterned layers (i.e., the dummy oxide 1002, the dummy gate 1004, the nitride hardmask 1006, and the oxide hardmask 1008). The elongated structures 1102 may be formed by patterning the dummy gate structure (i.e., the dummy oxide 1002 and the dummy gate 1004) and the hardmask layers (i.e., the nitride hardmask 1006 and the oxide hardmask 1008) using, for example, photolithography and etching techniques. For example, a mask layer (which is different from the hardmask layers and is not shown) may be formed over the topmost layer (i.e., 1008 in FIG. 10). The mask layer may be formed using low-pressure chemical vapor deposition (LPCVD) or plasma enhanced chemical vapor deposition (PECVD), for example.

The mask layer may be patterned using photolithography techniques. Generally, photolithography techniques utilize a photoresist material (not shown) that is deposited, irradiated (exposed), and developed to remove a portion of the photoresist material. The remaining photoresist material protects the underlying material, such as the hardmask layers in this example, from subsequent processing steps, such as etching. For example, the photoresist material is used to pattern the hardmask layers to form a patterned mask.

The patterned hardmask may be subsequently used to pattern exposed portions of the dummy gate structure (i.e., the dummy oxide 1002 and the dummy gate 1004) to form trenches (or openings) thereby defining the patterned dummy gate structures between adjacent trenches (or to form the elongated structures 1102 as shown in FIG. 11). When multiple patterned dummy gate structures are formed, such a trench may be disposed between any adjacent ones of the patterned dummy gate structures. In some embodiments, the patterned dummy gate structures are formed by etching trenches in the dummy gate structure (i.e., the dummy oxide 1002 and the dummy gate 1004) using, for example, reactive ion etch (RIE), neutral beam etch (NBE), the like, or combinations thereof. The etching process may be anisotropic. In some embodiments, the trenches may be strips (when viewed from the top) parallel to each other, and closely spaced with respect to each other. In some embodiments, the trenches may be continuous and surround the patterned dummy gate structures.

Figure 3:
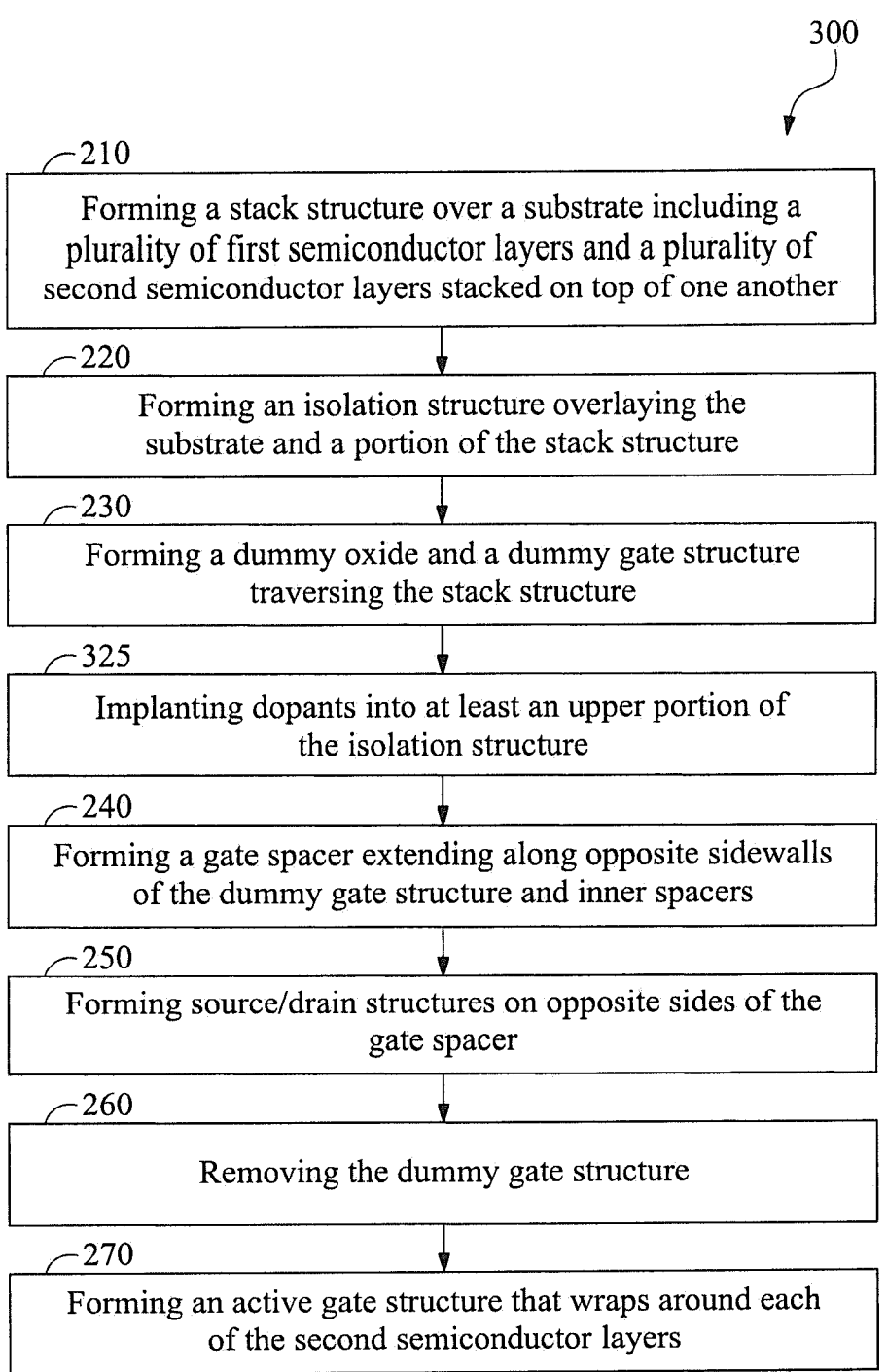
Figures 11A, 11B:
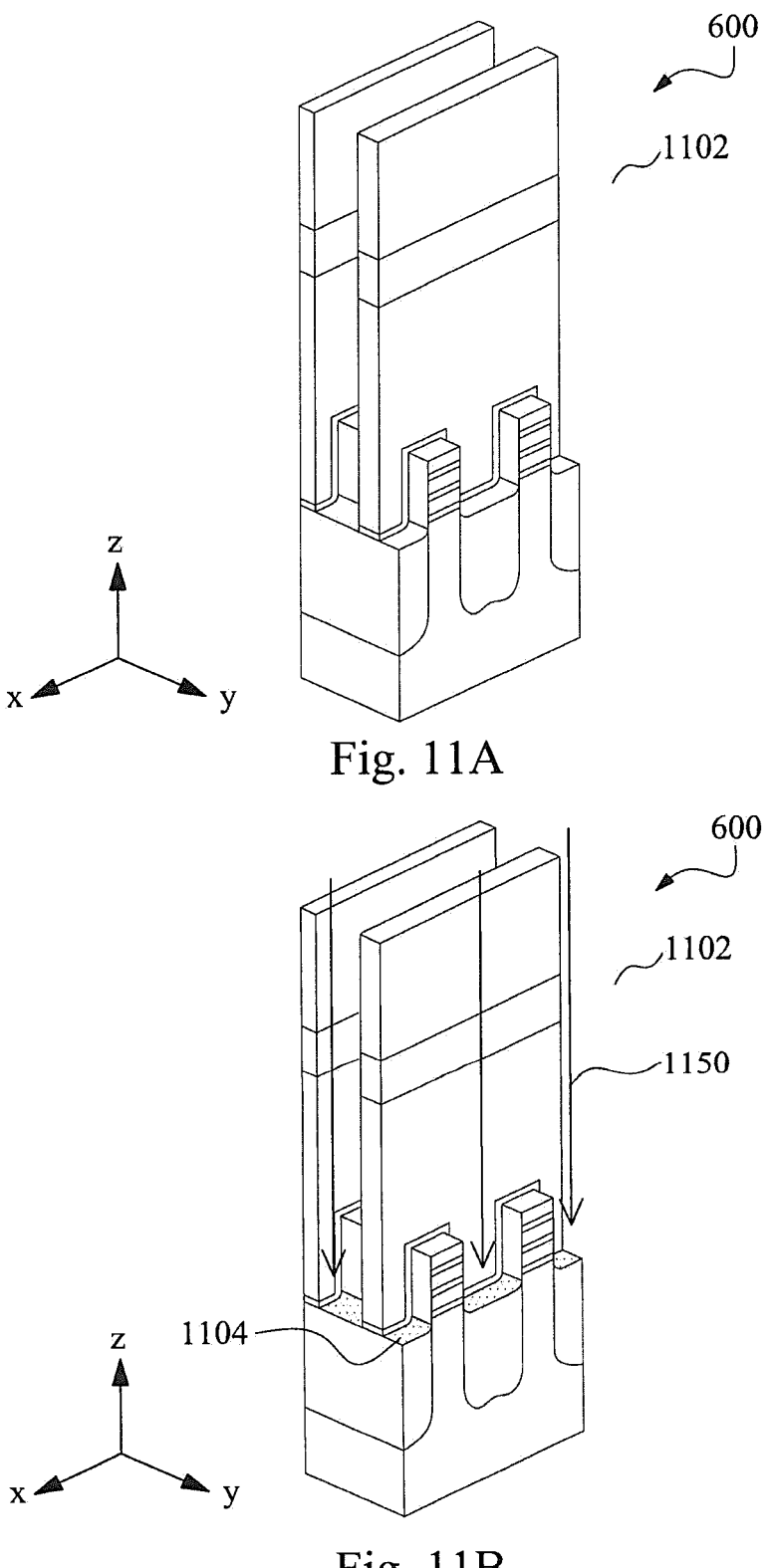

In some embodiments, in which operation 225 is omitted, an implantation process 1150 may be performed to form implanted layers 1104 after forming the elongated structures 1102, as shown in FIG. 11B and illustrated in the flowchart of FIG. 3. Corresponding to operation 325 in FIG. 3, FIG. 11B is a schematic view of the GAA FET device 600, wherein the implantation process 1150 is performed to form implanted layers 1104 in the top portion of the dummy oxide 1002. The implantation process 1150 may be an ion implantation process, for example, configured to dope exposed portions of the dummy oxide 1002 with a dopant species. In some embodiments, the dopant may include carbon, or silicon, or combinations thereof. In some embodiments, a dosage (or concentration) of the implanted dopants may be greater than zero and may have an upper limit of about $3E^{22}$ atoms/cm$^3$. The implanted layers 1104 are formed in a portion of the dummy oxide 1002 and may extend down to a portion of the isolation structure 902, wherein a depth (or thickness) of the implanted layers 1104 measured from the top surface of the isolation structure 902 is less than about 20 nm, such as about 10 nm or about 15 nm. In some embodiments, the implantation process 1150 may be implemented with an implantation energy, the implantation energy ranging from about 0.3 keV to about 50 keV. For example, the implantation energy may be about 1 KeV for carbon dopants, while the implantation energy may be about 2 KeV for silicon dopants. In some embodiments, an anneal process (e.g., a rapid thermal anneal process) may be performed after performing the implantation process. The anneal process may include more than one step at different temperatures. In some embodiments, the implantation process may be performed at a relatively high temperature. In some embodiments, including methods 200, 400, and 500 described with respect to FIG. 2, FIG. 4, and FIG. 5, operation 325 may be omitted.

Corresponding to operation 240 of FIG. 2, FIG. 12 is a schematic view of the GAA FET device 600 including a gate spacer 1202, at one of the various stages of fabrication. As shown in FIG. 12, the gate spacer 1202 is formed over the GAA FET device 600. More specifically, the gate spacer 1202 is formed over the elongated structures 1102 such that the top and sidewalls of the elongated structures 1102 may be covered with the gate spacer 1202, and the gate spacer 1202 may contact the top surface of the elongated structures 1102 (e.g., the patterned portion of the oxide hardmask 1008 as shown in FIG. 12). The gate spacer 1202 is formed over the fin structure 802 such that the gate spacer 1202 may extend along sidewalls of the fin structure 802, and the gate spacer 1202 may cover the top surface of the fin structure 802 (e.g., the top surface of the nanostructures 804 as shown in FIG. 12). The gate spacer 1202 is formed over the isolation structure 902.

Although the gate spacer 1202 is shown as a single layer in FIG. 12, it should be understood that the gate spacer 1202 may be formed to have any number of layers while remaining within the scope of the present disclosure. The gate spacer 1202 may be a low-k spacer and may be formed of a suitable dielectric material, such as silicon oxide, silicon oxycarbonitride, or the like. Any suitable deposition method, such as thermal oxidation, chemical vapor deposition (CVD), or the like, may be used to form the gate spacer 1202. The shapes and formation methods of the gate spacer 1202 as illustrated in FIG. 12 is merely non-limiting examples, and other shapes and formation methods are possible. These and other variations are fully intended to be included within the scope of the present disclosure.

Figures 12A, 12B:
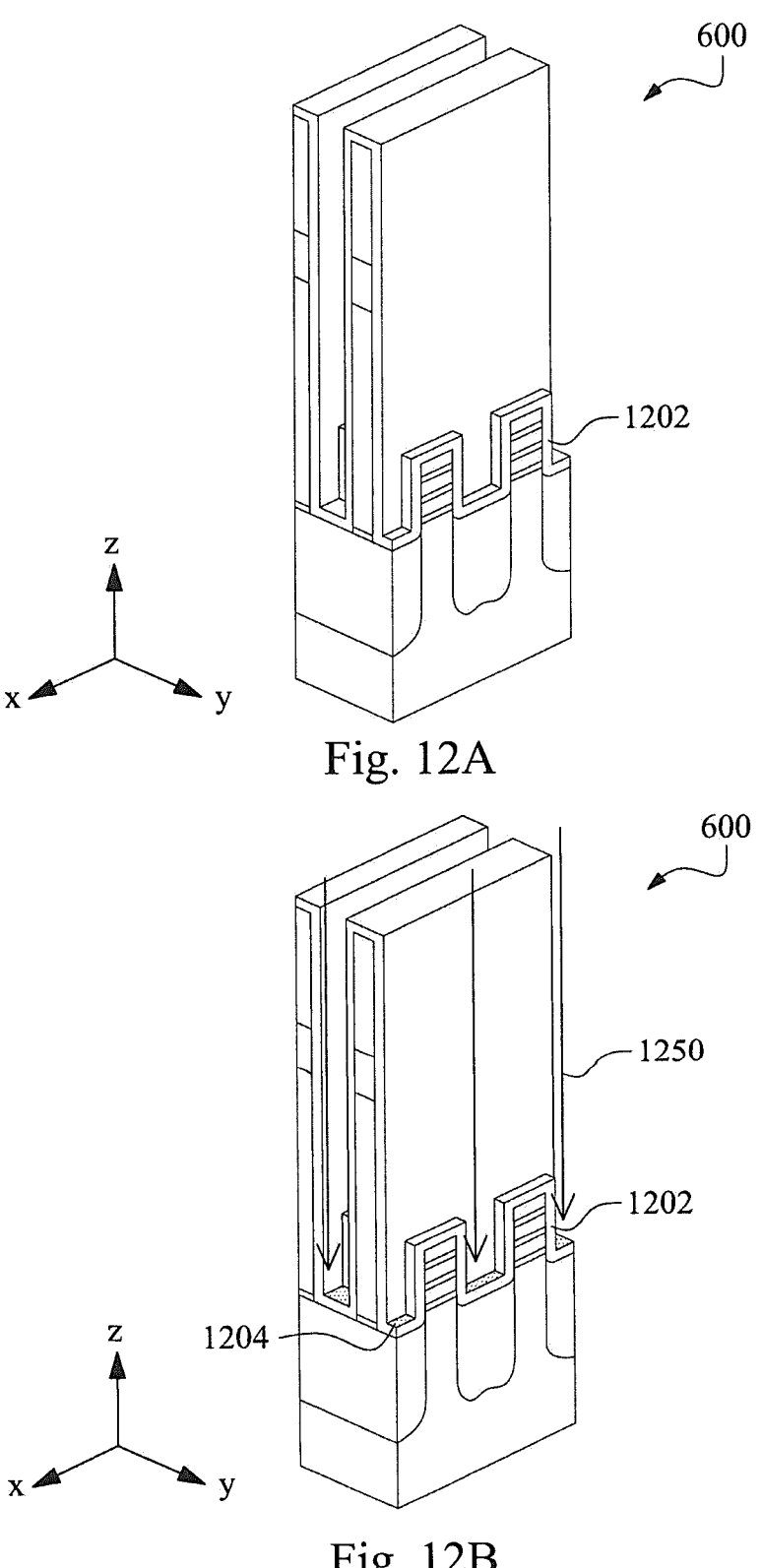

In some embodiments, in which operation 225 and/or 325 are omitted, an implantation process 1250 may be performed to form implanted layers 1204 after forming the gate spacer 1202, as shown in FIG. 12B and illustrated in the flowchart of FIG. 4. Corresponding to operation 425 in FIG. 4, FIG. 12B is a schematic view of the GAA FET device 600, wherein the implantation process 1250 is performed to form implanted layers 1204 in the top portion of the gate spacer 1202. The implantation process 1250 may be an ion implantation process, for example, configured to dope exposed portions of the gate spacer 1202 with a dopant species. In some embodiments, the dopant may include carbon, or silicon, or combinations thereof. In some embodiments, a dosage (or concentration) of the implanted dopants may be greater than zero and may have an upper limit of about $3E^{22}$ atoms/cm$^3$. The implanted layers 1204 are formed in a portion of the gate spacer 1202 and may extend down to a portion of the isolation structure 902, wherein a depth (or thickness) of the implanted layers 1204 measured from the top surface of the isolation structure 902 is less than about 20 nm, such as about 10 nm or about 15 nm. In some embodiments, the implantation process 1250 may be implemented with an implantation energy, the implantation energy ranging from about 0.3 keV to about 50 keV. For example, the implantation energy may be about 1 KeV for carbon dopants, while the implantation energy may be about 2 KeV for silicon dopants. In some embodiments, an anneal process (e.g., a rapid thermal anneal process) may be performed after performing the implantation process. The anneal process may include more than one step at different temperatures. In some embodiments, the implantation process may be performed at a relatively high temperature. In some embodiments, including methods 200, 300, and 500 described with respect to FIG. 2, FIG. 3, and FIG. 5, operation 425 may be omitted.

Figure 13:
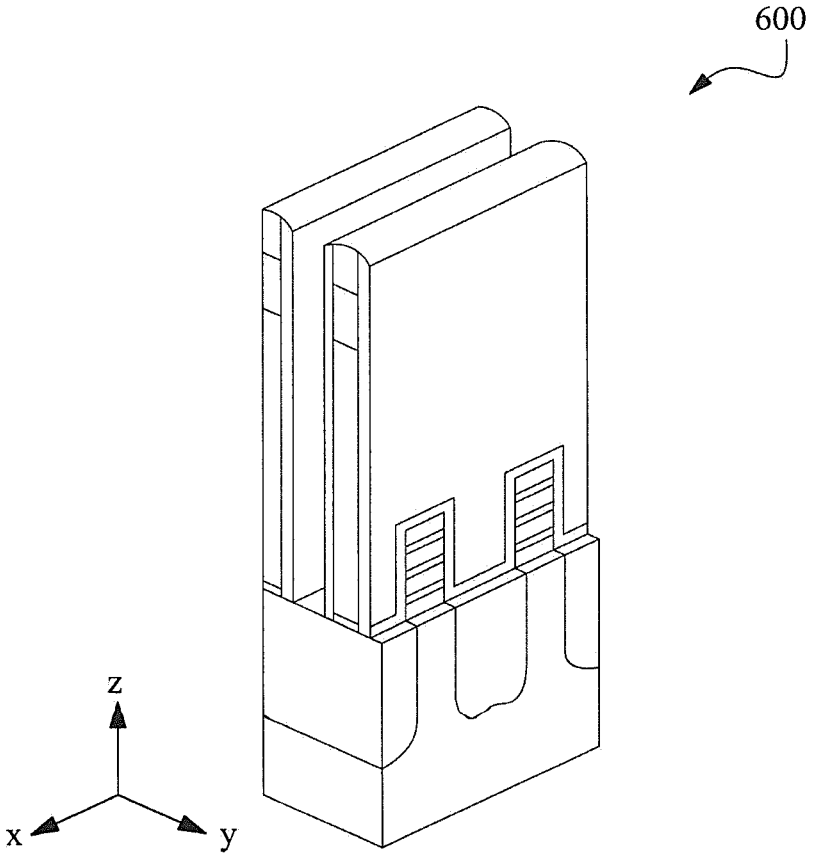

Still corresponding to operation 240 of FIG. 2, FIG. 13 is a schematic view of the GAA FET device 600 where portions of the fin structure 802 that are exposed by the elongated structures 1102, portions of the gate spacer 1202 formed thereon, and portions of the gate spacer 1202 formed on the top surface of the isolation structure 902 are removed at one of the various stages of fabrication. The hardmask layers can serve as a mask to etch the exposed (non-overlaid) portions of the fin structure 802, which results in the fin structure 802 having respective remaining portions of the sacrificial structures 806 and the nanostructures 804. As a result, when viewed from the x-direction, newly formed sidewalls of the fin structure 802 are vertically aligned with the sidewalls of the gate spacer 1202.

Figure 14:
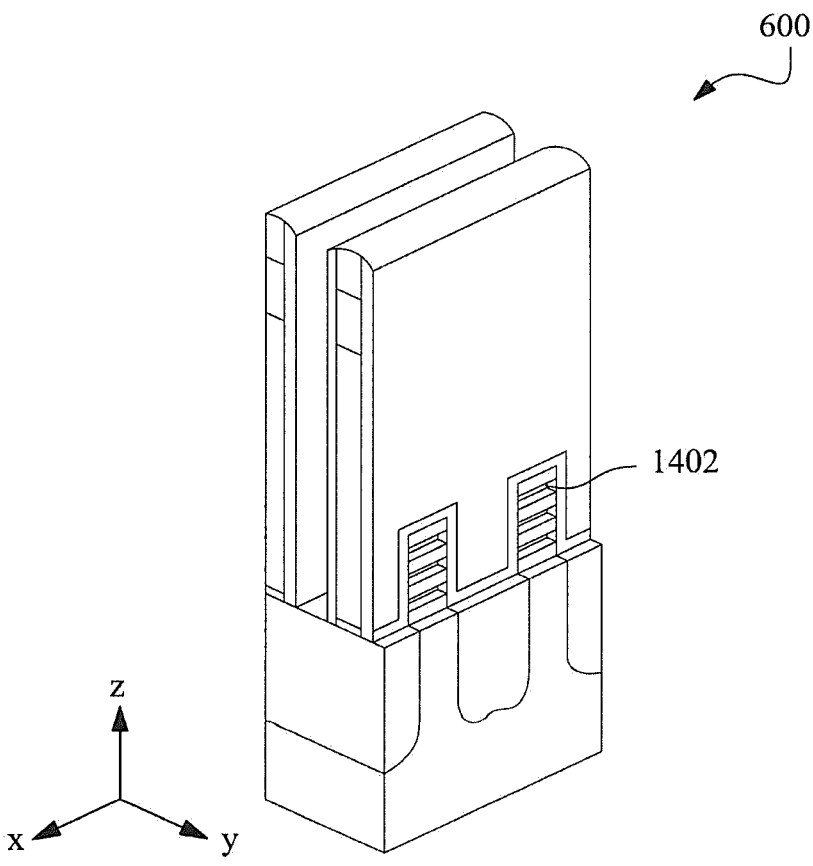

Next, still corresponding to operation 240 of FIG. 2, FIG. 14 is a schematic view of the GAA FET device 600 where respective end portions of each of the sacrificial structures 806 are removed (i.e., recessed in the y-direction when viewed from the x-direction). In an example, the sacrificial structures 806 may include SiGe, and the nanostructures 804 may include Si. The recess process may include a hydrogen chloride (HCl) gas isotropic etch process, in which SiGe is etched without attacking Si. As such, the Si layers (i.e., the nanostructures 804) may remain intact during this process while the SiGe layers (i.e., the sacrificial structures 806) may be recessed. Consequently, a pair of recesses can be formed on the ends of each of the sacrificial structures 806.

Figure 15:
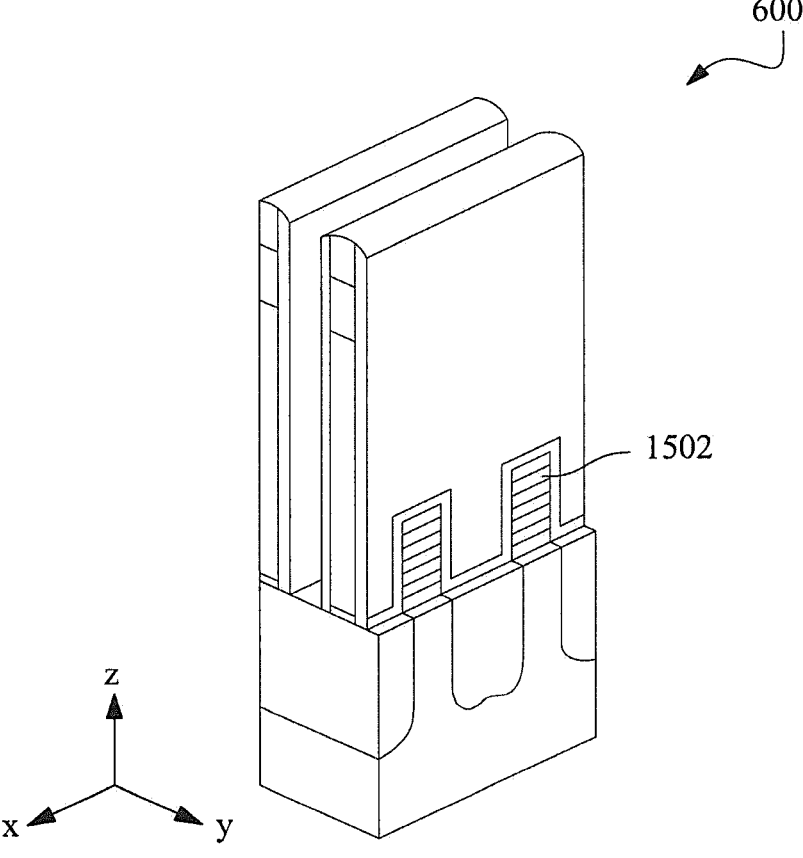

Next, still corresponding to operation 240 of FIG. 2, FIG. 15 is a schematic view of the GAA FET device 600 where inner spacers 1502 are formed. A number of inner spacers 1502 may be respectively formed by filling up the recesses (i.e., the end portions of the sacrificial structures 806). For example, a number of inner spacers 1502 can be formed along the respective etched ends of each of the sacrificial structures 806. As such, the inner spacers 1502 may inherit the dimensions and profiles of the recesses. For example, when viewed from the x-direction, newly formed sidewalls of the fin structure 802, including the inner spacers 1502, are vertically aligned with the sidewalls of the gate spacer 1202.

The inner spacers 1502 may be formed conformally by chemical vapor deposition (CVD), or by monolayer doping (MLD) of nitride followed by spacer RIE. The inner spacers 1502 may be deposited using, e.g., a conformal deposition process and one or more subsequent isotropic and/or anisotropic etching-back processes to remove excess spacer material on the sidewalls of the fin structure 802 and on a surface of the substrate 602. The inner spacers 1502 may be formed of silicon nitride, silicoboron carbonitride, silicon carbonitride, silicon carbon oxynitride, or any other type of dielectric material (e.g., a dielectric material having a dielectric constant k of less than about 5) appropriate to the role of forming an insulating gate sidewall spacers of transistors.

Figure 16:
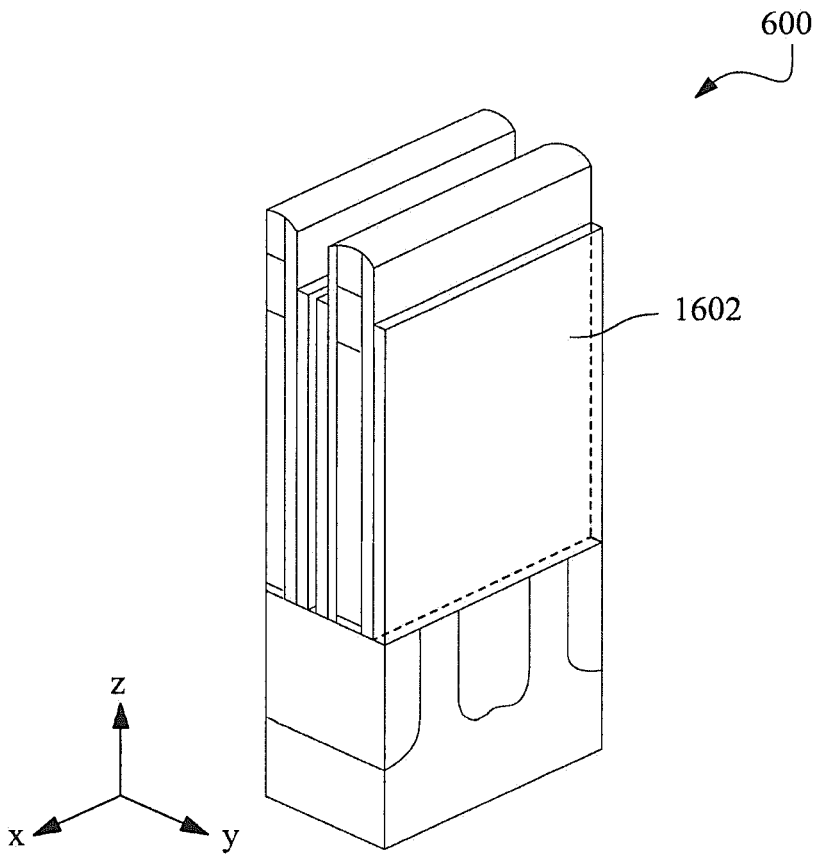

Corresponding to operation 250 of FIG. 2, FIG. 16 is a schematic view of the GAA FET device 600 where source/drain structures 1602 are formed on the sides of the fin structure 802 (with the inner spacers 1502 disposed therebetween).

Corresponding to operation 260 of FIG. 2, FIG. 17 is a schematic view of the GAA FET device 600 wherein the hardmask layers and the dummy gate structure are removed. As shown in FIG. 17, the gate spacer 1202 and the source/drain structures 1602 remain, while portions of the fin structures 802 are exposed. In accordance with various embodiments, the dummy gate structure may be (e.g., concurrently) removed by applying a selective etch (e.g., a hydrochloric acid (HCl)), while leaving the sacrificial structures 806 and the nanostructures 804 substantially intact.

Figure 17A:
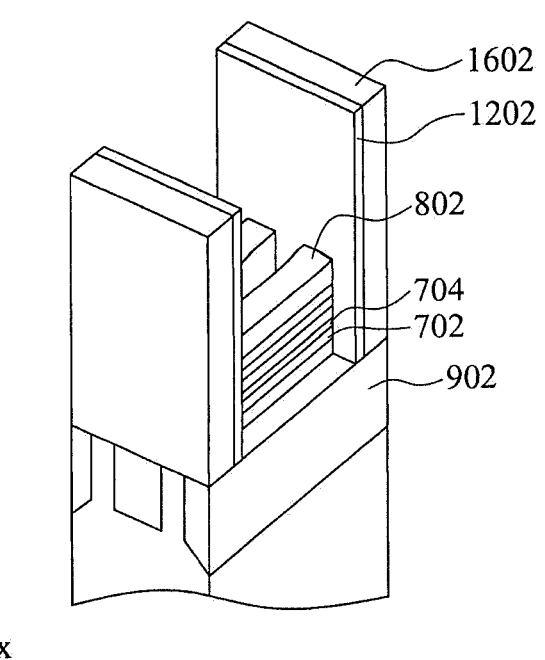
Figure 17B:
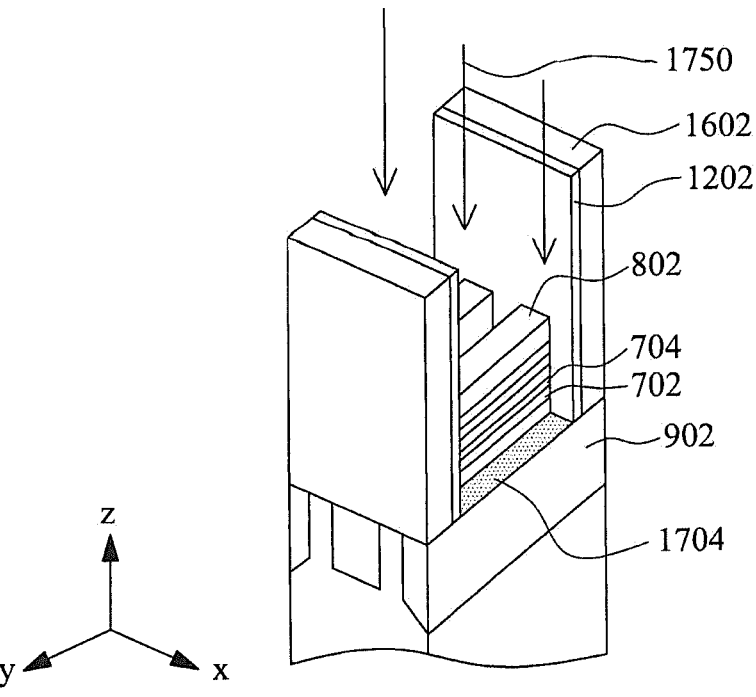

In some embodiments, in which operation 225, 325 and/or 425 are omitted, an implantation process 1750 may be performed to form implanted layers 1704 after removing the dummy gate structure, as shown in FIG. 17B and illustrated in the flowchart of FIG. 5. Corresponding to operation 525 in FIG. 5, FIG. 17B is a schematic view of the GAA FET device 600, wherein the implantation process 1750 is performed to form implanted layers 1704 in the top portion of the isolation structure 902. The implantation process 1750 may be an ion implantation process, for example, configured to dope exposed portions of the isolation structure 902 with a dopant species. In some embodiments, the dopant may include carbon, or silicon, or combinations thereof. In some embodiments, a dosage (or concentration) of the implanted dopants may be greater than zero and may have an upper limit of about $3E^{22}$ atoms/cm$^3$. In some embodiments, the implanted layers 1704 may be formed in the top portion of the isolation structure 902, wherein a depth (or thickness) of the implanted layers 1704 measured from the top surface of the isolation structure 902 may be less than about 20 nm, such as about 10 nm or about 15 nm. In some embodiments, the implantation process 1750 may be implemented with an implantation energy, the implantation energy ranging from about 0.3 keV to about 50 keV. For example, the implantation energy may be about 1 KeV for carbon dopants, while the implantation energy may be about 2 KeV for silicon dopants. In some embodiments, an anneal process (e.g., a rapid thermal anneal process) may be performed after performing the implantation process. The anneal process may include more than one step at different temperatures. In some embodiments, the implantation process may be performed at a relatively high temperature. In some embodiments, including methods 200, 300, and 400 described with respect to FIGS. 2-4, operation 525 may be omitted.

Figure 18:
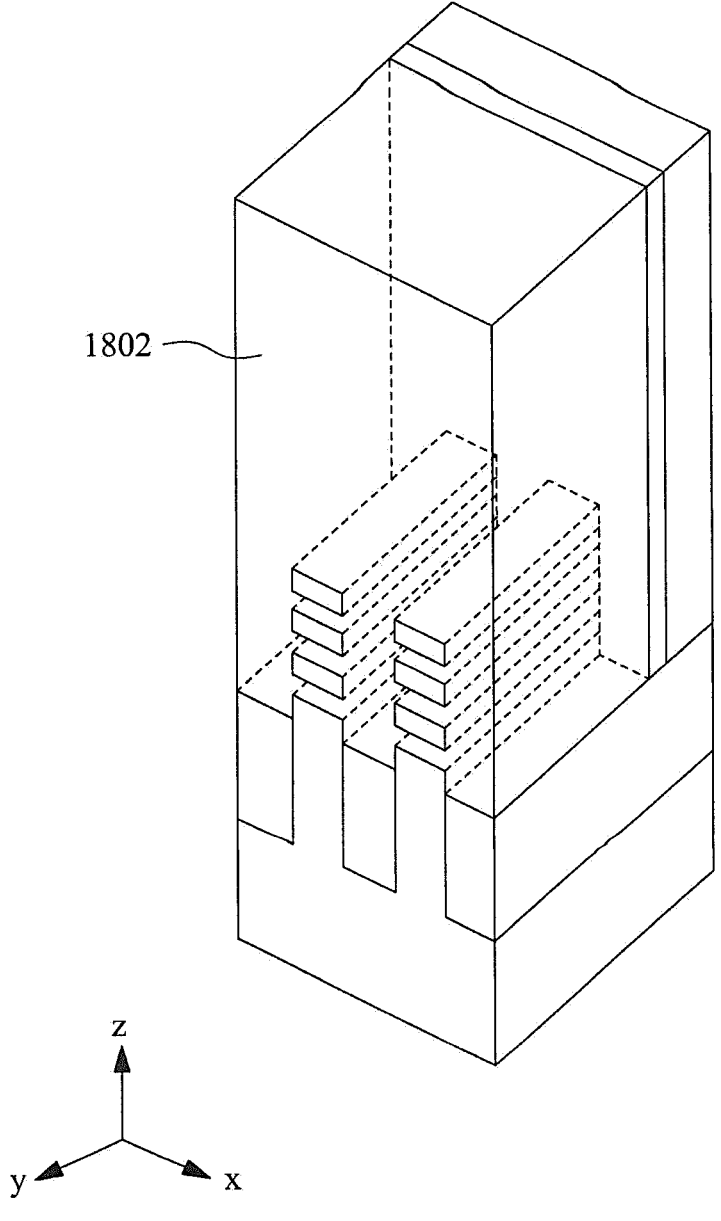

Next, corresponding to operation 270 of FIG. 2, FIG. 18 is a schematic view of the GAA FET device 600 wherein an active gate structure 1802 is formed to wrap around each of the nanostructures 804. The sacrificial structures 806 is removed prior to forming the active gate structure 1802. For example, the sacrificial structures 806 may be removed in a substantially similar way to remove the dummy gate structure. In various embodiments, the sacrificial structures 806 may be removed by applying a selective etch (e.g., a hydrochloric acid (HCl)), while leaving the nanostructures 804 substantially intact. After the removal of the sacrificial structures 806, a gate trench, exposing respective sidewalls of each of the nanostructures 804 that face the x direction, may be formed. After the removal of the sacrificial structures 806 to further extend the gate trench, respective bottom surface and/or top surface of each of the nanostructures 804 may be exposed. Consequently, a full circumference of each of the nanostructures 804 can be exposed. Next, the active gate structure 1802 is formed to wrap around each of the nanostructures 804.

The active gate structure 1802 may include a gate dielectric and a gate metal, in some embodiments. The gate dielectric may wrap around each of the nanostructures 804, e.g., the top and bottom surfaces and sidewalls facing the x direction). The gate dielectric may be formed of different high-k dielectric materials or a similar high-k dielectric material. Example high-k dielectric materials may include a metal oxide or a silicate of Hf, Al, Zr, La, Mg, Ba, Ti, Pb, and combinations thereof. The gate dielectric may include a stack of multiple high-k dielectric materials. The gate dielectric may be deposited using any suitable method, including, for example, molecular beam deposition (MBD), atomic layer deposition (ALD), PECVD, and the like. In some embodiments, the gate dielectric may optionally include a substantially thin oxide (e.g., $SiO_x$) layer, which may be a native oxide layer formed on the surface of each of the nanostructures 804.

The gate metal may wrap around each of the nanostructures 804 with the gate dielectric disposed therebetween. Specifically, the gate metal may include a number of gate metal sections abutted to each other along the z direction. Each of the gate metal sections may extend not only along a horizontal plane (e.g., the plane expanded by the x direction and the y direction), but also along a vertical direction (e.g., the z direction). As such, two adjacent ones of the gate metal sections may adjoin together to wrap around a corresponding one of the nanostructures 804, with the gate dielectric disposed therebetween.

The gate metal may include a stack of multiple metal materials. For example, the gate metal may be a p-type work function layer, an n-type work function layer, multi-layers thereof, or combinations thereof. The work function layer may also be referred to as a work function metal. Example p-type work function metals that may include TiN, TaN, Ru, Mo, Al, WN, $ZrSi_2$, $MoSi_2$, $TaSi_2$, $NiSi_2$, WN, other suitable p-type work function materials, or combinations thereof. Example n-type work function metals that may include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the work function layer is chosen to tune its work function value so that a target threshold voltage Vt is achieved in the device that is to be formed. The work function layer(s) may be deposited by CVD, physical vapor deposition (PVD), ALD, and/or other suitable process.

In one aspect of the present disclosure, a method for fabricating semiconductor devices is disclosed. The method includes forming a stack structure protruding from a substrate and including a plurality of first semiconductor layers and a plurality of second semiconductor layers stacked on top of one another. The method further includes forming an isolation structure overlaying the substrate and a lower portion of the stack structure. The method further includes implanting dopants into at least an upper portion of the isolation structure.

In another aspect of the present disclosure, a method for fabricating semiconductor devices is disclosed. The method includes forming a channel structure protruding from a substrate. The method further includes forming an isolation structure comprising oxide, and overlaying the substrate and a lower portion of the channel structure. The method further includes, prior to any step of potentially damaging the isolation structure, doping at least an upper portion of the isolation structure with dopants including at least one of carbon atoms or silicon atoms.

In yet another aspect of the present disclosure, a semiconductor device is disclosed. The semiconductor device comprises a plurality of nanostructures disposed above a substrate, vertically spaced from one another, and each extending along a first lateral direction. The semiconductor device further comprises an isolation structure disposed below the plurality of nanostructures, overlaying the substrate, and having at least its upper portion doped with one or more dopants. The semiconductor device further comprises a metal gate structure extending along a second lateral direction and wrapping around each of the plurality of nanostructures. The semiconductor device further comprises a pair of source/drain structures disposed on opposite sides of the metal gate structure along the first lateral direction.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating semiconductor devices, comprising:
   forming a stack structure protruding from a substrate and including a plurality of first semiconductor layers and a plurality of second semiconductor layers stacked on top of one another;
   forming an isolation structure overlaying the substrate and a lower portion of the stack structure; and
   prior to any step of potentially damaging the isolation structure, implanting dopants into at least an upper portion of the isolation structure.

2. The method of claim 1, wherein the dopants include at least one of carbon atoms or silicon atoms.

3. The method of claim 1, wherein a depth of the dopants extending into the isolation structure is less than about 20 nanometers.

4. The method of claim 1, wherein a dosage of the dopants is less than about $3 \times 10^{22}$ cm$^{-3}$.

5. The method of claim 1, following the step of implanting dopants into at least an upper portion of the isolation structure, further comprising:
   forming a dummy gate structure traversing the stack structure;
   forming a gate spacer extending along opposite sidewalls of the dummy gate structure;
   forming source/drain structures on opposite sides of the gate spacer, respectively; and
   replacing the dummy gate structure with an active gate structure that wraps around each of the second semiconductor layers.

6. The method of claim 1, prior to the step of implanting dopants into at least an upper portion of the isolation structure, further comprising:

forming a dummy gate structure traversing the stack structure.

7. The method of claim 6, following the step of implanting dopants into at least an upper portion of the isolation structure, further comprising:

forming a gate spacer extending along opposite sidewalls of the dummy gate structure;

forming source/drain structures on opposite sides of the gate spacer, respectively; and replacing the dummy gate structure with an active gate structure that wraps around each of the second semiconductor layers.

8. The method of claim 1, prior to the step of implanting dopants into at least an upper portion of the isolation structure, further comprising:

forming a dummy gate structure traversing the stack structure; and forming a gate spacer extending along opposite sidewalls of the dummy gate structure.

9. The method of claim 8, following the step of implanting dopants into at least an upper portion of the isolation structure, further comprising:

forming source/drain structures on opposite sides of the gate spacer, respectively; and replacing the dummy gate structure with an active gate structure that wraps around each of the second semiconductor layers.

10. The method of claim 1, prior to the step of implanting dopants into at least an upper portion of the isolation structure, further comprising:

forming a dummy gate structure traversing the stack structure;

forming a gate spacer extending along opposite sidewalls of the dummy gate structure;

forming source/drain structures on opposite sides of the gate spacer, respectively; and removing the dummy gate structure.

11. The method of claim 10, following the step of implanting dopants into at least an upper portion of the isolation structure, further comprising:

forming an active gate structure that wraps around each of the second semiconductor layers.

12. A method for fabricating semiconductor devices, comprising:

forming a channel structure protruding from a substrate;

forming an isolation structure comprising oxide, and overlaying the substrate and a lower portion of the channel structure; and prior to any step of potentially damaging the isolation structure, doping at least an upper portion of the isolation structure with dopants including at least one of carbon atoms or silicon atoms.

13. The method of claim 12, wherein the channel structure includes a plurality of first semiconductor layers and a plurality of second semiconductor layers stacked on top of one another.

14. The method of claim 12, wherein the channel structure includes a material identical to a material of the substrate and continuously extends from the substrate.

15. The method of claim 12, wherein the any step includes removing portions of the channel structure that are disposed on opposite sides of a dummy gate structure.

16. The method of claim 12, wherein the any step includes removing portions of a dummy oxide that are disposed on opposite sides of a dummy gate.

17. The method of claim 12, wherein the any step includes forming source/drain structures on opposite sides of a dummy gate structure.

18. The method of claim 12, wherein a depth of the dopants extending into the isolation structure is less than about 20 nanometers.

19. A semiconductor device, comprising:

a plurality of nanostructures disposed above a substrate, vertically spaced from one another, and each extending along a first lateral direction;

an isolation structure disposed below the plurality of nanostructures, overlaying the substrate, and having at least an upper portion of the isolation structure doped with one or more dopants such that a dielectric property of the upper portion is different from a dielectric property of a bottom portion of the isolation structure;

a metal gate structure extending along a second lateral direction and wrapping around each of the plurality of nanostructures; and a pair of source/drain structures disposed on opposite sides of the metal gate structure along the first lateral direction.

20. The semiconductor device of claim 19, wherein the dopants include at least one of carbon atoms or silicon atoms.

* * * * *